US009036360B2

(12) United States Patent
Kim

(10) Patent No.: US 9,036,360 B2
(45) Date of Patent: May 19, 2015

(54) POWER CASING APPARATUS OF IMAGE DISPLAY MODULE

(75) Inventor: Yong Min Kim, Jeonju-si (KR)

(73) Assignee: EVERBRIGHTEN CO., LTD. (KR)

( * ) Notice: Subject to any disclaimer, the term of this patent is extended or adjusted under 35 U.S.C. 154(b) by 363 days.

(21) Appl. No.: 13/606,225

(22) Filed: Sep. 7, 2012

(65) Prior Publication Data

US 2013/0176694 A1 Jul. 11, 2013

(30) Foreign Application Priority Data

Jan. 9, 2012 (KR) ........................ 10-2012-0002614

(51) Int. Cl.
*H05K 5/00* (2006.01)
*G09F 9/33* (2006.01)

(52) U.S. Cl.
CPC ........................................ *G09F 9/33* (2013.01)

(58) Field of Classification Search
CPC ........................................................ G09F 9/33
USPC ......... 361/728–731, 735, 752, 753, 756, 775, 361/785, 788
See application file for complete search history.

(56) References Cited

U.S. PATENT DOCUMENTS

| | | | | |
|---|---|---|---|---|
| 6,154,945 | A | 12/2000 | Voelzke | |
| 6,169,632 | B1 * | 1/2001 | Kurtenbach et al. | 359/621 |
| 6,839,238 | B2 * | 1/2005 | Derr et al. | 361/735 |

* cited by examiner

*Primary Examiner* — Jayprakash N Gandhi
*Assistant Examiner* — Mukund G Patel
(74) *Attorney, Agent, or Firm* — Cantor Colburn LLP

(57) ABSTRACT

A power casing apparatus of an image display module includes a display panel configured to have a Light-Emitting Diode module disposed in a front thereof; a bus bar unit installed in the rear of the display panel and configured to supply driving power to the LED module and to have a pair of electrode blades disposed on one side thereof; and a power casing unit disposed in the bus bar unit in such a way as to be attached to or detached from the bus bar unit and configured to supply the driving power to the bus bar unit and to have a pair of power supply connectors disposed at positions corresponding to the respective electrode blades on one side.

9 Claims, 4 Drawing Sheets

POWER CASING APPARATUS OF IMAGE DISPLAY MODULE

CROSS REFERENCE TO RELATED APPLICATION

This application claims the benefit of Korean Patent Application No. 10-2012-0002614, filed Jan. 9, 2012, which is hereby incorporated by reference in its entirety into this application.

BACKGROUND OF THE INVENTION

1. Technical Field

The present invention relates to the power casing apparatus of an image display module and, more particularly, to the power casing apparatus of an image display module in which a power supply unit can be easily attached to or detached from the image display module.

2. Description of the Related Art

An electric bulletin board is used as an image display devices for displaying advertisements or images, and a plurality of an image display module is arranged in a matrix form in the electric bulletin board. Light-Emitting Diodes (LEDs) are used as the image display modules in order to represent a variety of colors or reduce power consumption. Each of the LEDs is used to display information about the pixel of an image signal.

The image display module used in an electric bulletin board using LEDs. The image display module described in the prior art document includes outer frames, a center frame, an LED board, and connection members. The outer frames have a quadrangle. The center frame is formed at the center of the outer frames and configured to form a space so that a control unit is included in the space. The center frame includes a cover for covering the rear. Both ends of the LED board are combined with the front of the outer frames and the center frame, and the connection members consecutively couple the outer frames up and down or left and right so that the image display modules are fixed according to the size of the electric bulletin board or is easily disassembled.

The cover is combined with the center frame by screws, and a power input/output terminal for supplying power to a control unit, an image output device, or a data I/O terminal for sending data from a computer are disposed under the center frame.

SUMMARY OF THE INVENTION

A conventional image display module is problematic in that a repair and check for an image display module are not easy because the repair is performed in the state in which a cover is separated from a center frame by releasing fastening members, such as screws, or the image display module is detached from an electric bulletin board, when an error occurs in a power supply unit for supplying driving power necessary to drive the image display module using the center frame and the cover.

An object of the present invention is to provide the power casing apparatus of an image display module in which a power supply unit can be easily attached to or detached from the image display module.

Another object of the present invention is to provide the power casing apparatus of an image display module, which facilitates a repair and check when an error occurs in a power supply unit because the power supply unit can be easily attached to or detached from the image display module.

The power casing apparatus of an image display module according to the present invention includes a display panel configured to have an LED module disposed in a front thereof; a bus bar unit installed in the rear of the display panel and configured to supply driving power to the LED module and to have a pair of electrode blades disposed on one side thereof; and a power casing unit disposed in the bus bar unit in such a way as to be attached to or detached from the bus bar unit and configured to supply the driving power to the bus bar unit and to have a pair of power supply connectors disposed at positions corresponding to the respective electrode blades on one side, wherein the power supply connectors are electrically connected or disconnected from the electrode blades by attaching or detaching the power casing unit to or from the bus bar unit.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, embodiments of the power casing apparatus of an image display module according to the present invention are described with reference to the accompanying drawings.

Figure 1:
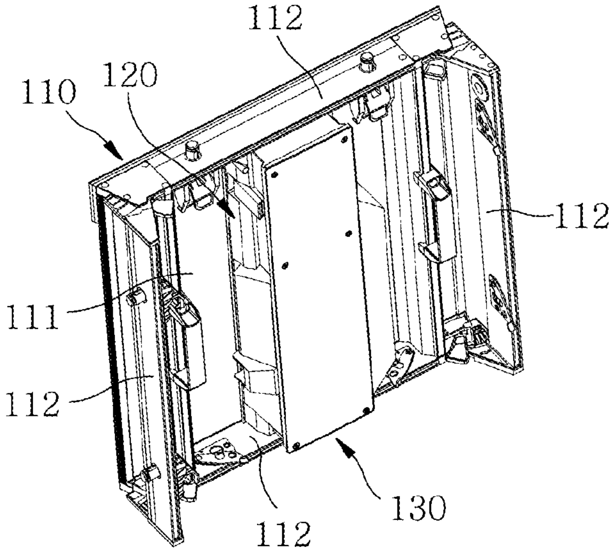
FIG. 1 is a perspective view of an image display module according to the present invention.
Figure 2:
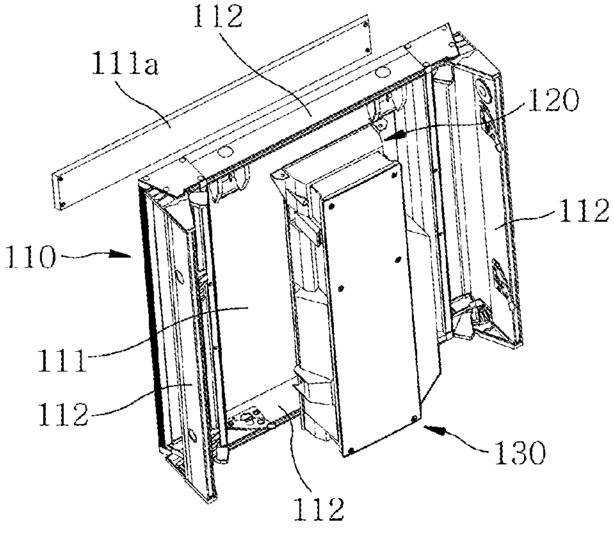
FIG. 2 is a perspective view showing the partial disassembly and assembly of the image display module shown in FIG. 1.
Figure 3:
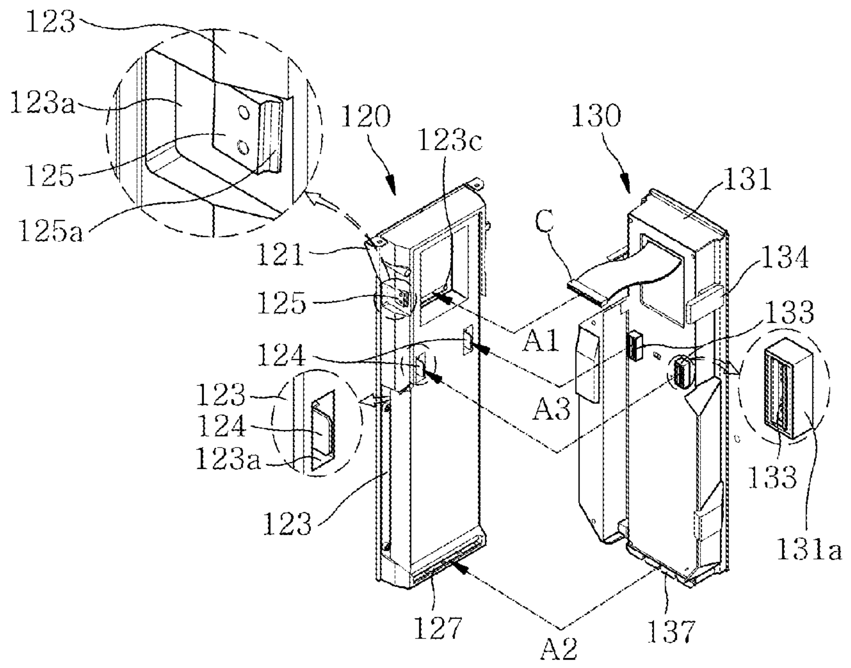
FIG. 3 is a perspective view of a bus bar unit and a power casing unit shown in FIG. 2.

As shown in FIGS. 1 to 3, the power casing apparatus of an image display module according to the present invention includes a display panel 110, a bus bar unit 120, and a power casing unit 130.

A Light-Emitting Diode (LED) module 111*a* is disposed in the front of the display panel 110. The bus bar unit 120 is disposed in the rear of the display panel 110 and is configured to supply driving power to the LED module 111*a*. A pair of electrode blades 124 is disposed on one side of the bus bar unit 120. The power casing unit 130 is disposed in the bus bar unit 120 in such a way as to be attached to or detached from the bus bar unit 120 and is configured to supply driving power to the bus bar unit 120. A pair of power supply connectors 133 is disposed at positions, corresponding to the respective electrode blades 124, on one side of the power casing unit 130. When the power casing unit 130 is attached to or detached from the bus bar unit 120, the power supply connectors 133 are electrically connected to or disconnected from the electrode blades 124. The construction of the power casing apparatus of the image display module according to the present invention is described in more detail below with reference to the accompanying drawings.

The display panel 110 includes a panel frame 111 and a plurality of outer frames 112, as shown in FIGS. 1 and 2.

The panel frame 111 generally supports the power casing apparatus of the image display module according to the present invention, and the LED module 111*a* for displaying an image is disposed in the front of the panel frame 111. The plurality of outer frames 112 is disposed in the respective edges of the panel frame 111.

Figure 4:
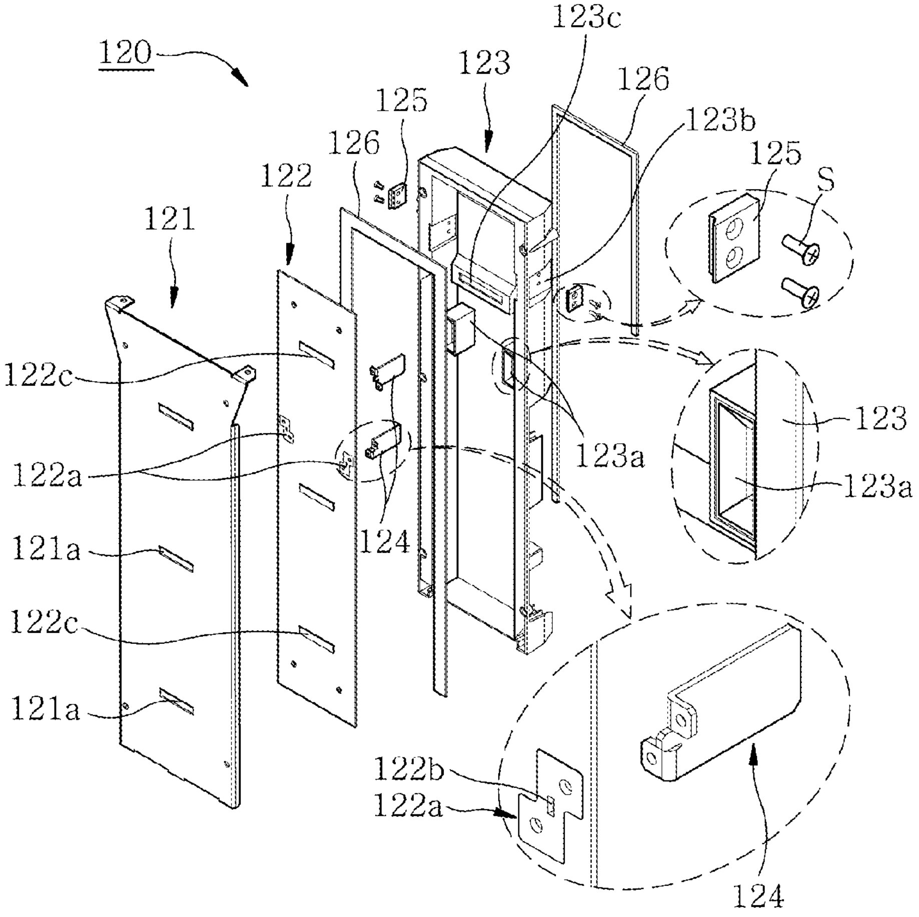
FIG. 4 is a perspective view showing the disassembly of the bus bar unit shown in FIG. 3.

The bus bar unit 120 includes a bus bar panel 121, a Printed Circuit Board (PCB) 122, a bus bar casing 123, the pair of electrode blades 124, and a pair of latches members 125, as shown in FIGS. 3 and 4.

The bus bar panel 121 is disposed in the rear of the display panel 110 using fastening members (not shown), such as screws. A plurality of cable through holes 121*a* into which electric cables (not shown) for supplying driving power to the LED module 111*a* is formed in the bus bar panel 121.

The PCB 122 is disposed in the rear of the bus bar panel 121 using fastening members (not shown), such as screws. A pair of blade pads 122*a* in which respective insertion holes 122*b* are formed is formed on one side of the PCB 122. A circuit device (not shown) for receiving driving power from the power casing unit 130 and controlling a display of the LED module 111*a* is mounted on the PCB 122. A plurality of cable through holes 122*c* into which electric cables (not shown) connected to the LED module 111*a* are inserted in order to supply the driving power of the circuit device to the LED module 111*a* is formed in the PCB 122. The plurality of cable through holes 122*c* is formed at positions corresponding to the respective cable through holes 121*a* of the bus bar panel 121.

The bus bar casing 123 is disposed in the rear of the bus bar panel 121. A pair of connector insertion members 123*a* is formed on one side of the bus bar casing 123, and insertion grooves 123*b* are formed on the sides of the bus bar casing 123, respectively. A cable insertion member 123*c* into which an electric cable connector C is inserted is formed on the lower side between the pair of connector insertion members 123*a* of the bus bar casing 123. The electric cable connector C is connected between the PCB 122 and a control board 136 and is configured to transfer the control signal of the image display module, generated from the control board 136, to the PCB 122.

The pair of electrode blades 124 is soldered to the blade pads 122*a* of the PCB 122 so that they are inserted into the respective connector insertion members 123*a* of the bus bar casing 123. Each of the pair of electrode blades 124 includes a blade body 124*a*, a blade insertion member 124*b*, and a pair of blade solder members 124*c*.

The blade body 124*a* is disposed in such a way as to be inserted into the connector insertion member 123*a* of the bus bar casing 123 and is connected to the power supply connector 133. The blade insertion member 124*b* is extended up to the blade body 124*a* and is disposed in such a way as to be inserted into an insertion hole 122*b* formed in the blade pad 122*a* of the PCB 122. The pair of blade solder members 124*c* is extended in a direction to cross the blade body 124*a* so that they are disposed on side and the other side of the blade insertion member 124*b*, respectively. The pair of blade solder members 124*c* is soldered to the blade pads 122*a* of the PCB 122.

The pair of latches members 125 is disposed in the insertion grooves 123*b* of the bus bar casing 123, respectively, and is configured to have latches 134 engaged therewith or separated therefrom. A shock absorbing member 126 is inserted into the bus bar casing 123 in which the latch members 125 engaged with the latches 134 are disposed when the bus bar casing 123 is installed in the bus bar panel 121. The shock absorbing member 126 is made of Ethylene-Vinyl Acetate (EVA).

Figure 5:
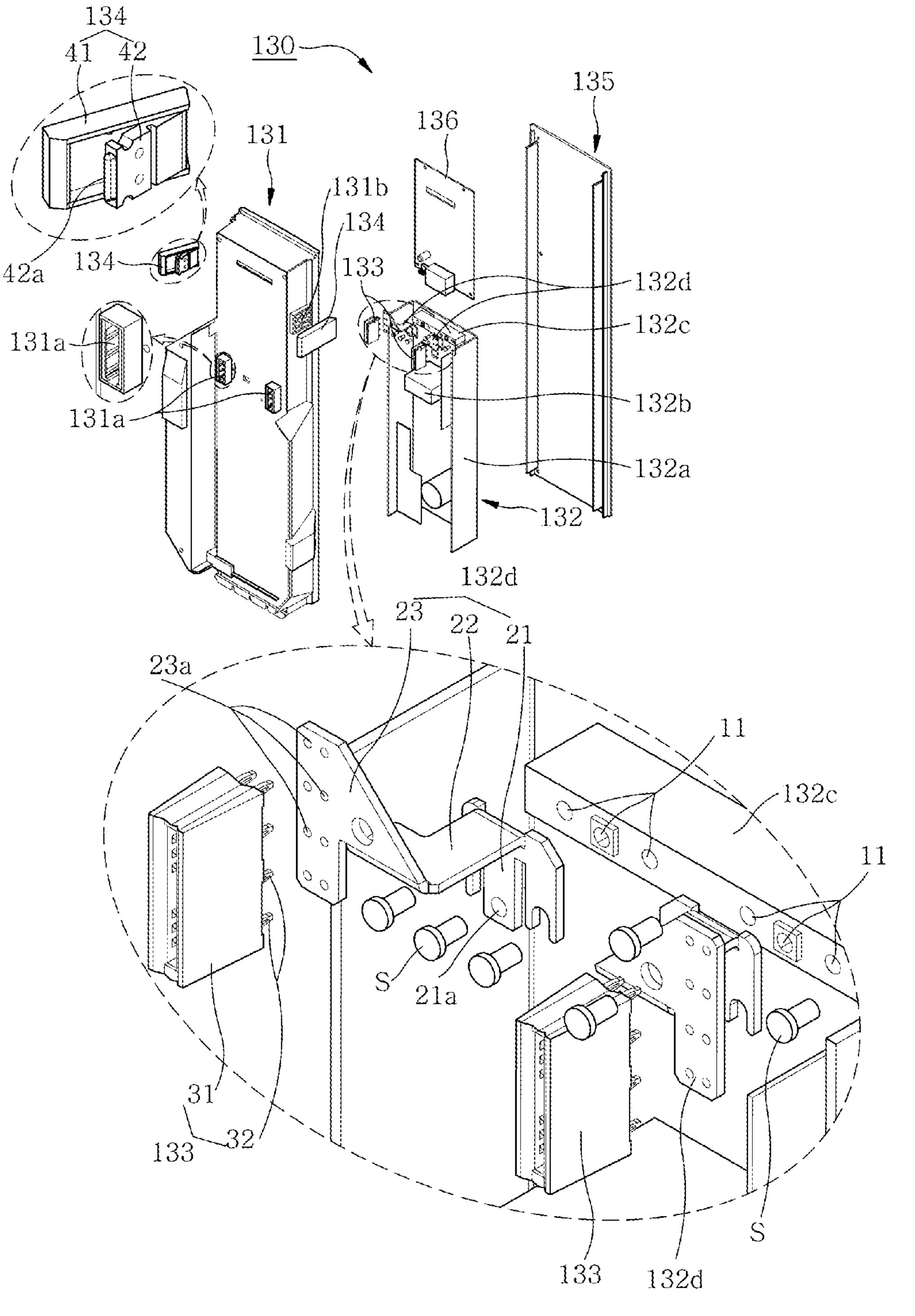
FIG. 5 is a perspective view showing the disassembly and assembly of the power casing unit shown in FIG. 3.

The power casing unit 130 includes a protection casing 131, a power supply unit 132, a pair of power supply connectors 133, a pair of latches 134, and a protection cover 135, as shown in FIGS. 3 and 5.

The protection casing 131 generally supports the power casing unit 130 and includes a pair of connector insertion members 131*a* into which the respective power supply connectors 133 are inserted.

The power supply unit 132 is disposed in the rear of the protection casing 131 and is configured to generate and supply the driving power for driving the LED module 111A. The power supply unit 132 includes a support panel 132*a*, a Switching Mode Power Supply (SMPS) 132*b*, a terminal block 132*c*, and a pair of connection electrodes 132*d*.

The support panel 132*a* is installed in the rear of the protection casing 131 and is configured to generally support the power supply unit 132. The SMPS 132*b* is installed in the front of the support panel 132*a* and is configured to receive external commercial AC, convert the commercial AC into DC, and generate the driving power. The terminal block 132*c* is connected to one side of the SMPS 132*b* and is configured to have a plurality of first fastening holes 11 formed therein. The terminal block 132*c* is connected to the PCB (not shown) of the SMPS 132*b* is configured to transfer the driving power of the SMPS 132*b* to the connection electrodes 132*d*.

The pair of connection electrodes 132*d* has second fastening holes 21*a* formed therein, respectively, so that the connection electrodes 132*d* are connected to the first fastening holes 11 of the terminal block 132*c*, respectively, using fastening members S, such as bolts or screws. The pair of connection electrodes 132*d* is connected to the power supply connectors 133. Each of the pair of connection electrodes 132*d* includes a connection electrode plate 21, a support electrode plate 22, and a soldering plate 23.

The connection electrode plate 21 is connected to the terminal block 132*c* and is configured to have a second fastening hole 21*a* formed therein. The support electrode plate 22 is formed in such a way as to be extended in a direction to cross the connection electrode plate 21. The soldering plate 23 is formed in such a way as to be extended in a direction to cross the support electrode plate 22. A plurality of insertion holes 23*a* is arranged in the support electrode plate 22.

The pair of power supply connectors 133 is installed on one side of the power supply unit 132 and is electrically connected to or disconnected from the electrode blades 124. Each of the pair of power supply connectors 133 includes a connector housing 31 and a plurality of lead pins 32. The connector housing 31 is inserted into the connector insertion member 131*a* of the protection casing 131, and the plurality of lead pins 32 is inserted into the connector housing 31. The plurality of insertion holes 23*a* formed in the soldering plate 23 is inserted into the connector housing 31.

The pair of latches 134 is disposed on the sides of the protection casing 131, respectively, and is attached to or detached from the latch members 125 of the bus bar unit 120. Each of the pair of latches 134 includes a sheet spring member 41 and a lever 42. The sheet spring member 41 is disposed on the side of the protection casing 131. The lever 42 is connected to the sheet spring member lever 42 so that it receives elastic force from the sheet spring member lever 42 and is attached to or detached from the latch member 125 of the bus bar unit 120 so that it is engaged with or separated from the latch member 125.

The protection cover 135 is disposed in the rear of the protection casing 131. The control board 136 is connected to the PCB 122 through the electric cable connector C and is configured to generate the control signal of the image display module and transfer the control signal to the PCB 122 so that an image is displayed on the image display module.

The operation of the power casing apparatus of the image display module according to the present invention is described below.

In the power casing apparatus of the image display module according to the present invention, the image display module includes the display panel 110, the bus bar unit 120, and the power casing unit 130 so that the power supply unit 132 is easily attached to or detached from the image display module.

The LED module 111*a* is disposed in the display panel 110, and the bus bar unit 120 is configured to supply the driving power from the power supply unit 132 of the power casing unit 130 to the LED module 111*a*. The bus bar unit 120 is fixed to the rear of the display panel 110 using fastening members (not shown), such as bolt or screws. The pair of electrode blades 124 is disposed on one side of the bus bar unit 120.

The driving power generated from the power supply unit 132 of the power casing unit 130 is supplied to the bus bar unit 120 by attaching or detaching the power casing unit 130 to or from the bus bar unit 120 fixed to the display panel 110. To this end, the pair of power supply connectors 133 is disposed in the power casing unit 130 and connected to the power supply unit 132 so that the driving power is supplied to the bus bar unit 120 through the electrode blades 124.

In an operation of inserting the electrode blades 124 into the power supply connectors 133, first, the electric cable connector C connected to the control board 136 is connected to the cable insertion member 123*c* of the bus bar casing 123 as indicated by an arrow A1, as shown in FIG. 2. After the connection of the electric cable connector C is completed, the alignment guide protrusion member 137 formed in the protection casing 131 of the power casing unit 130 is inserted into the alignment guide groove 127 formed in the bus bar casing 123 of the bus bar unit 120 and then fixed thereto as indicated by an arrow A2.

After the alignment guide protrusion member 137 is inserted into the alignment guide groove 127, the power casing unit 130 is guided to the bus bar unit 120 and then fixed thereto so that the power supply connectors 133 are inserted into the electrode blades 124, as indicated by an arrow A3. Here, the pair of electrode blades 124 and the pair of power supply connectors 133 are used because the driving power use DC.

After the power casing unit 130 is guided to the bus bar unit 120 and then fixed thereto, the pair of latches 134 is latched with the latch members 125 so that the power casing unit 130 is firmly fixed to the bus bar unit 120. A process of detaching the power casing unit 130 from the bus bar unit 120 is performed in opposite order of the attaching process.

The driving power generated from the power supply unit 132 of the power casing unit 130 is supplied to the bus bar unit 120 or not supplied thereto by attaching or detaching the bus bar unit 120 and the power casing unit 130. Accordingly, a repair and check can be easily performed when an error occurs in the power supply unit 132.

The power casing apparatus of the image display module according to the present invention is advantageous in that a repair and check are easy when an error occurs in the power supply unit because the power supply unit can be easily attached to or detached from the image display module.

The power casing apparatus of the image display module according to the present invention can be applied to all manufacture fields of the electric bulletin board.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power casing apparatus of an image display module, comprising:

a display panel configured to have a Light-Emitting Diode (LED) module disposed in a front thereof;

a bus bar unit installed in a rear of the display panel and configured to supply driving power to the LED module and to have a pair of electrode blades disposed on one side thereof, wherein the bus bar unit comprises: a bus bar panel disposed in the rear of the display panel; a Printed Circuit Board (PCB) disposed in a rear of the bus bar panel and configured to have a pair of blade pads, having respective insertion holes formed therein, formed on one side thereof; a bus bar casing disposed in the rear of the bus bar panel and configured to have a pair of connector insertion members formed on one side thereof and to have insertion grooves formed on respective sides thereof, the pair of electrode blades being soldered to the blade pads of the PCB in such a way as to be inserted into the respective connector insertion members of the bus bar casing; and a pair of latches members disposed in the respective insertion grooves of the bus bar casing; and a power casing unit disposed in the bus bar unit in such a way as to be attached to or detached from the bus bar unit and configured to supply the driving power to the bus bar unit and to have a pair of power supply connectors disposed at positions corresponding to the respective electrode blades on one side, wherein the power supply connectors are electrically connected or disconnected from the electrode blades by attaching or detaching the power casing unit to or from the bus bar unit.

2. The power casing apparatus of claim 1, wherein the display panel comprises:

a panel frame configured to have the LED module disposed in a front thereof; and a plurality of outer frames disposed in edges of the panel frame, respectively.

3. The power casing apparatus of claim 1, wherein each of the pair of electrode blades comprises:

a blade body inserted into the connector insertion member of the bus bar casing;

a blade insertion member formed in the blade body in such a way as to be extended and inserted into an insertion hole formed in the blade pad of the PCB; and a pair of blade solder members formed in such a way as to be extended in a direction to cross the blade body so that the pair of blade solder members is placed on one side and the other side of the blade insertion member, respectively, and solder to the blade pads of the PCB.

4. The power casing apparatus of claim 1, wherein:

a shock absorbing member is interposed between the bus bar panel and the bus bar casing, and the shock absorbing member is made of Ethylene-Vinyl Acetate (EVA).

5. The power casing apparatus of claim 1, wherein the power casing unit comprises:

a protection casing;

a power supply unit disposed in a rear of the protection casing and configured to generate the driving power for driving the LED module and supply the generated driving power, wherein the power supply connectors are disposed on one side of the power supply unit;

a pair of latches disposed on sides of the protection casing, respectively, and attached to or detached from latch members of the bus bar unit; and a protection cover disposed in a rear of the protection casing.

6. The power casing apparatus of claim 5, wherein the power supply unit comprises:

a support panel disposed in the rear of the protection casing;

a Switching Mode Power Supply (SMPS) disposed in a front of the support panel and configured to receive external commercial AC, convert the commercial AC into DC, and generate the driving power;

a terminal block connected to one side of the SMPS and configured to have a plurality of first fastening holes formed therein; and a pair of connection electrodes configured to have second fastening holes formed therein so that the pair of connection electrodes is connected to the first fastening holes of the terminal block, respectively, by fastening members and connected to the power supply connectors.

7. The power casing apparatus of claim 6, wherein each of the pair of connection electrodes comprises:

a connection electrode plate connected to the terminal block and configured to have the second fastening hole formed therein;

a support electrode plate formed in such a way as to be extended in a direction to cross the connection electrode plate; and a soldering plate formed in such a way as to be extended in a direction to cross the support electrode plate and configured to have a plurality of insertion holes arranged therein.

8. The power casing apparatus of claim 7, wherein each of the pair of power supply connectors comprises:

a connector housing; and a plurality of lead pins inserted into the connector housing and configured to have a plurality of insertion holes, formed in the soldering plate, inserted thereto.

9. The power casing apparatus of claim 5, wherein the pair of latches comprises:

sheet spring members disposed on sides of the protection casing, respectively; and a lever connected to receive elastic force of the sheet spring members and attached to or detached from the latch members of the bus bar unit.

* * * * *